United States Patent
Qin et al.

(10) Patent No.: US 9,397,068 B2
(45) Date of Patent: Jul. 19, 2016

(54) PACKAGE IN PACKAGE (PIP) ELECTRONIC DEVICE AND MANUFACTURING METHOD THEREOF

(71) Applicants: Fei Qin, Beijing (CN); Guofeng Xia, Beijing (CN); Tong An, Beijing (CN); Wei Wu, Beijing (CN); Chengyan Liu, Beijing (CN); Wenhui Zhu, Beijing (CN)

(72) Inventors: Fei Qin, Beijing (CN); Guofeng Xia, Beijing (CN); Tong An, Beijing (CN); Wei Wu, Beijing (CN); Chengyan Liu, Beijing (CN); Wenhui Zhu, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 14/354,583

(22) PCT Filed: Dec. 4, 2012

(86) PCT No.: PCT/CN2012/085785
§ 371 (c)(1),
(2) Date: Jul. 2, 2014

(87) PCT Pub. No.: WO2013/097581
PCT Pub. Date: Jul. 4, 2013

(65) Prior Publication Data
US 2015/0348934 A1    Dec. 3, 2015

(30) Foreign Application Priority Data

Dec. 30, 2011  (CN) .......................... 2011 1 0456464

(51) Int. Cl.
*H01L 23/495*  (2006.01)
*H01L 23/00*   (2006.01)
(Continued)

(52) U.S. Cl.
CPC ............ *H01L 24/85* (2013.01); *H01L 21/4821* (2013.01); *H01L 21/4828* (2013.01); *H01L 21/56* (2013.01); *H01L 23/142* (2013.01); *H01L 23/28* (2013.01); *H01L 23/3121* (2013.01); *H01L 23/49575* (2013.01);
(Continued)

(58) Field of Classification Search
CPC ................................. H01L 23/18; H01L 24/42
See application file for complete search history.

(56) References Cited

U.S. PATENT DOCUMENTS 6,258,626 B1 * 7/2001 Wang ...................... H01L 24/11
257/777
6,613,606 B1 * 9/2003 Lee ........................ H01L 21/563
257/E21.503

FOREIGN PATENT DOCUMENTS

CN         101506975        8/2009
CN         102222657        10/2011
(Continued)

*Primary Examiner* — Cheung Lee
(74) *Attorney, Agent, or Firm* — Han IP Corporation

(57) ABSTRACT

A manufacturing method for Package in Package (PiP) electronic device based on multi-row Quad Flat No-lead (QFN) package is provided wherein the lower surface of plate metallic base material are half-etched to form grooves. Insulation filling material is filled in the half-etched grooves. The upper surface of plate metallic base material is half-etched to form chip pad and multi-row of leads. Encapsulating IC chip for wire bonding, adhesive material, metal wire, chip pad and a plurality of leads to form a multi-row QFN package as an inner package. Flip-chip bonding IC chip with solder bumps on the first metal material layer of leads. Encapsulating IC chip with solder bumps, the multi-row QFN package, adhesive material, and leads to form an array of PiP electronic devices. Sawing and separating the PiP electronic device array, forming PiP electronic device unit.

5 Claims, 14 Drawing Sheets

(51) Int. Cl.
  *H01L 21/48* (2006.01)
  *H01L 21/56* (2006.01)
  *H01L 23/14* (2006.01)
  *H01L 23/52* (2006.01)
  *H01L 23/28* (2006.01)
  *H01L 23/498* (2006.01)
  *H01L 23/31* (2006.01)
  *H01L 25/03* (2006.01)

(52) U.S. Cl.
  CPC ......... *H01L 23/49861* (2013.01); *H01L 23/52* (2013.01); *H01L 24/81* (2013.01); *H01L 24/97* (2013.01); *H01L 21/561* (2013.01); *H01L 23/49544* (2013.01); *H01L 24/16* (2013.01); *H01L 24/32* (2013.01); *H01L 24/48* (2013.01); *H01L 24/73* (2013.01); *H01L 25/03* (2013.01); *H01L 2224/16245* (2013.01); *H01L 2224/32245* (2013.01); *H01L 2224/48091* (2013.01); *H01L 2224/48095* (2013.01); *H01L 2224/48227* (2013.01); *H01L 2224/73265* (2013.01); *H01L 2224/92247* (2013.01); *H01L 2224/97* (2013.01); *H01L 2924/00014* (2013.01); *H01L 2924/171* (2013.01); *H01L 2924/181* (2013.01); *H01L 2924/3011* (2013.01); *H01L 2924/30107* (2013.01)

(56) References Cited

FOREIGN PATENT DOCUMENTS

| | | |
|---|---|---|
| CN | 102231376 | 11/2011 |
| CN | 102446882 | 5/2012 |
| CN | 202384324 | 8/2012 |
| KR | 100747996 | 3/2001 |

* cited by examiner

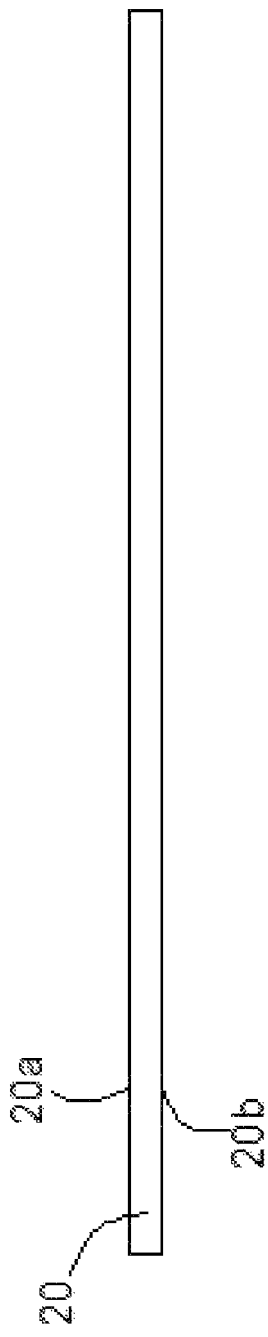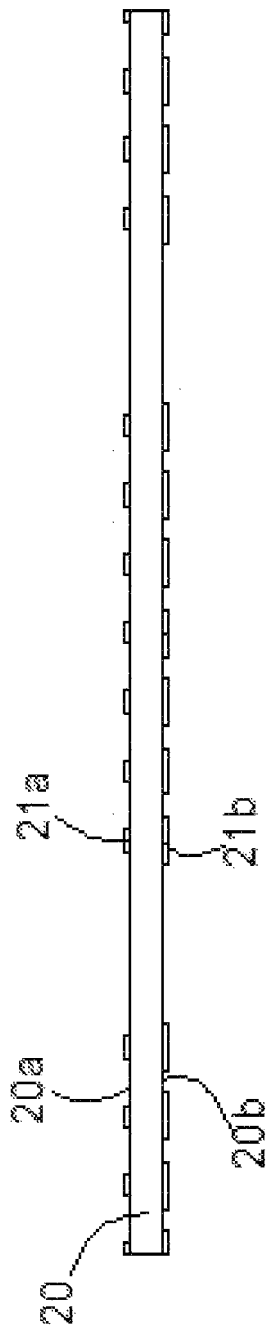
FIG. 5A
FIG. 5B

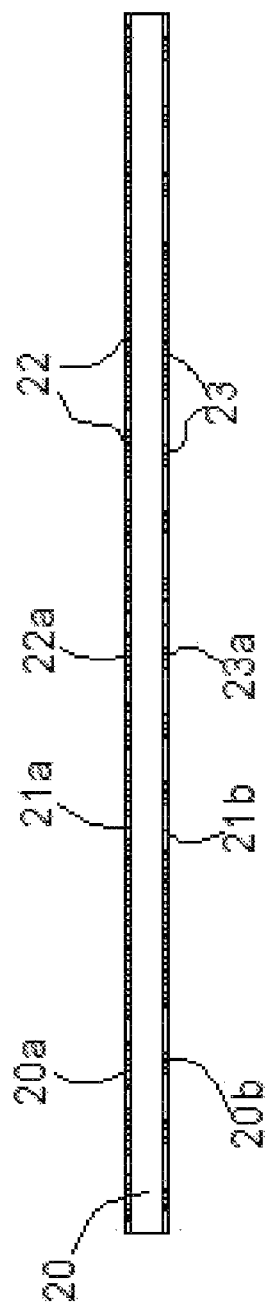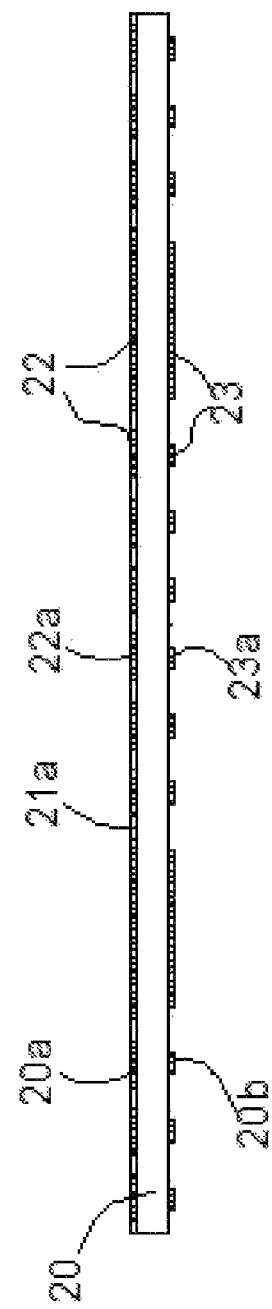
FIG. 5C
FIG. 5D

PACKAGE IN PACKAGE (PIP) ELECTRONIC DEVICE AND MANUFACTURING METHOD THEREOF

CROSS-REFERENCE TO RELATED APPLICATION

This application is the national phase application of International application number PCT/CN2012/085785, filed Dec. 4, 2012, which claims the priority benefit of Chinese Patent Application No. 201110456464.X, filed on Dec. 30, 2011, which is hereby incorporated by reference in its entirety.

TECHNICAL FIELD

The present invention relates to electronic devices fabrication technology, and more particularly relates to a Package in Package (PiP) electronic device based on multi-row Quad Flat No-lead (QFN) package and a manufacturing method thereof.

BACKGROUND

With the miniaturized, portable, ultra-thin, multi-media and low cost-oriented development of electronic products such as mobile phones, laptops, etc., high-density, high-performance, high-reliability and low-cost package forms and the assembly technology have been developed rapidly. Compared with expensive packages such as BGA and the like, in recent years, the novel package technology have developed rapidly (that is, QFN package (Quad Flat Non-lead Package)). As they have the advantages of good thermal and electrical performance, small size, low cost, high productivity, etc., a new revolution in the field of microelectronics packaging technology is introduced.

FIG. 1A is a diagram illustrating bottom view of conventional QFN package. FIG. 1B is a diagram illustrating a cross-section view of conventional QFN package along line I-I of FIG. 1A. Conventional QFN package 100 includes a leadframe 11, a plastic mold material 12, an adhesive material 13, an IC chip 14 and a plurality of metal wires 15, wherein leadframe 11 comprises a chip pad 111 and a plurality of leads 112 arrayed around chip pad 111. IC chip 14 is attached to chip pad 111 via adhesive material 13. IC chip 14 is electrically connected with leads 112 via metal wires 15. IC chip 14, metal wires 15 and leadframe 11 are molded utilizing plastic mold material 12 for protection and support. Leads 112 exposed at the bottom surface of plastic mold material is soldered to printed circuit board (PCB not shown) to provide electrical connection with outside. Exposed chip pad 111 is soldered to printed circuit board (PCB not shown) to provide an excellent heat dissipation channel to release heat produced by IC chip 14. Compared with TSOP and SOIC packages, QFN package does not have a gull-wing shaped lead and has a short conductive path, low self-inductance coefficient and low impedance, thus providing sound electrical performance and meeting high-speed or microwave application requirement.

With the demand of high integration, high performance, high reliability and low cost of electronic devices, high lead number, and high reliability as well as low cost of electronic packages are required. However, conventional QFN package described before has some drawbacks, and cannot meet the requirements. As shown in FIG. 1A of conventional QFN package 100, just only a single row of leads 112 are arrayed around chip pad 111, thus limiting the number of leads 112.

As shown in FIG. 1B of conventional QFN package 100, leadframe 11 are effectively locked by mold material 12, resulting in poor adhesion between leadframe 11 and mold material 12, easily causing delamination failure, and even causing chip pad 111 and leads 112 to fall off. Furthermore, moisture may not be effectively prevented from diffusing into inside along the interface between leadframe 11 and mold material 12. During the molding process of conventional QFN package 100, an adhesive tape is required to paste on the bottom of leads 11 in advance to prevent overflow problem. After molding process, it is needed to remove the adhesive tape, thus increasing the manufacturing cost. During the sawing process of conventional QFN package 100, a blade saws the metal of leadframe 11 as well as mold material 12, thus not only lowering the sawing process efficiency and shorting the life of the blade, but also resulting in metal burrs problem. Therefore, in order to break through the bottleneck of the low density, improve the reliability and reduce the manufacturing cost of conventional QFN package, it is an urgent need to develop an advanced QFN package having the advantages of high reliability, low cost and high density, and a manufacturing method thereof.

SUMMARY

The present invention is to provide a Package in Package (PiP) electronic device based on multi-row QFN package and a manufacturing method thereof, so as to break through the bottleneck of the low density of conventional QFN package and to improve the reliability In order to achieve the abovementioned objective, the invention adopts the following technical proposal:

The invention proposes a manufacturing method of a Package in Package (PiP) electronic device. The PiP electronic device comprises:

a leadframe including a step-shaped structure along the vertical direction, an upper surface, a lower surface, a step surface, a chip pad, and a plurality of leads;

a chip pad located at the central position of leads and having step-shaped structure along the vertical direction at the four edges; and a plurality of leads arranged at the periphery of chip pad and around chip pad in multi-row format, also having step-shaped structure along the vertical direction;

the first metal material layer located on the upper surface of the leadframe;

the second metal material layer located on the lower surface of leadframe;

an IC chip for wire bonding fixed on the first metal material layer of leads through an adhesive, and located at the central position of chip pad;

an IC chip with solder bumps is flip-chip bonded on the first metal material layer of leads;

a plastic mold material located under the step-shaped structure of leads;

wire bonds used to connect IC chip for wire bonding with leads;

a mold material for encapsulating IC chip for wire bonding, IC chip with bumps, adhesive, leads and the first metal material layer.

The method of manufacturing the PiP electronic device comprises the following steps:

Step 1: forming patterned resist mask layers
forming patterned resist mask layer on the upper and lower surfaces of plate metallic base material, respectively;

Step 2: forming the first metal material layer and the second metal material layer forming the first metal material layer and the second metal material layer on the upper and lower surfaces of the plate metallic base material;

Step 3: half-etching the lower surface of plate metallic base material removing patterned resist mask layer on the lower surface of plate metallic base material; half-etching plate metallic base material with the second metal material layer as the mask; and forming grooves;

Step 4: filling insulation filling material filling insulation filling material into the grooves formed by half-etching the lower surface of plate metallic base material;

Step 5: half-etching the upper surface of plate metallic base material removing patterned resist mask layer on the upper surface of plate metallic base material; half-etching plate metallic base material with the first metal material layer as the mask; and forming leads having step-shaped structure and comprising the separated chip pad and multi-row of leads;

Step 6: fixing IC chip for wire bonding fixing IC chip for wire bonding on the first metal material layer of leads using adhesive, and at the central position of chip pad;

Step 7: wire bonding wire bonds are used to connect IC chip for wire bonding with leads;

Step 8: carrying out molding process encapsulating IC chip for wire bonding, adhesive, wire bonds, chip pad and a plurality of leads with mold material to form a multi-row QFN package as an inner package;

Step 9: bonding IC chip with solder bumps flip-chip bonding IC chip with solder bumps on the first metal material layer of leads; connecting the bumps with leads through reflowing bonding or thermo-compression bonding; and fixing IC chip with solder bumps on the multi-row QFN package through adhesive;

Step 10: carrying out molding process encapsulating IC chip with solder bumps, the multi-row QFN package, adhesive and leads to form an array of PiP electronic devices with mold material;

Step 11: printing carrying out the laser printing for the PiP electronic device array;

Step 12: sawing and separating process sawing and separating the PiP electronic device array, forming PiP electronic device unit.

According to an embodiment of the invention, the first metal material layer and the second metal material layer are formed with electroplating method or chemical plating method.

According to an embodiment of the invention, the upper surface and the lower surface of plate metallic base material are half-etched by using the first metal material layer and the second metal material layer as the mask and selecting the etchant only etch the plate metallic base material.

According to an embodiment of the invention, insulation filling material is filled in the half-etched grooves with screen printing method, coating method or other methods.

According to an embodiment of the invention, the solder bumps on IC chip are connected with leads by reflowing bonding or thermo-compression bonding.

According to an embodiment of the invention, the PiP electronic device is formed through once filling process and twice molding processes.

According to an embodiment of the invention, if blade sawing method, laser sawing method or water jet sawing method is used for forming PiP electronic device unit, only mold material and insulation filling material, rather than leadframe, are sawed.

Base on the abovementioned, PiP electronic device based on multi-row QFN package according to the present invention has high density. The step-shaped structure of leads has the interlocking effect between leads and mold material or insulation filling material, may effectively prevent the interfacial delamination as well as leads and chip pad from falling off. Moreover, the step-shaped structure of leads may effectively prevent moisture from diffusing from the outside of the package into the inside thereof. The first metal material layer and the second metal material layer located on the upper surface and the lower surface of leads respectively may effectively improve wire bonding and surface mounting quality. When the PiP electronic device array is sawed into PiP electronic device units, only plastic mold material and insulation filling material are sawed, thus improving sawing efficiency, prolonging the life of blade and preventing metal burrs from being generated. Meanwhile, unlike the manufacturing process of conventional QFN package, an adhesive tape is not required to paste on the bottom-side of leads in the manufacturing process of PiP electronic device in the present invention, thus reducing the manufacturing cost.

The abovementioned characteristics and advantages of the present invention are described in details with drawings and the following embodiments.

Figure 1A:
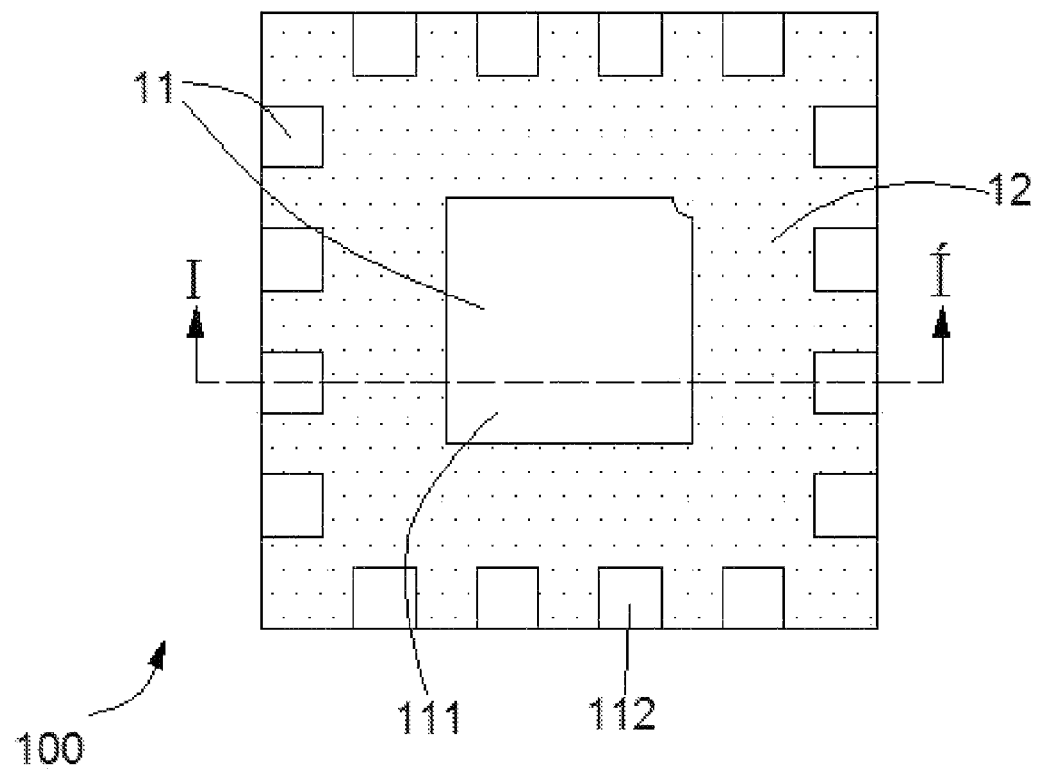
FIG. 1A is a bottom view of conventional QFN package.
Figure 1B:
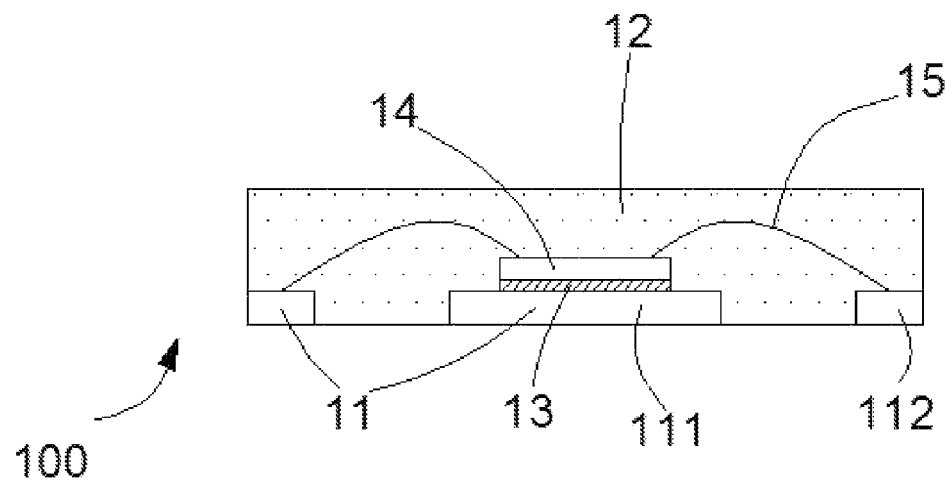
FIG. 1B is a cross-sectional view of conventional QFN package in FIG. 1A taken along line I-Í.

Reference numbers in the drawings refer to the following elements: 100: Conventional QFN Package; 11: Leadframe; 111: Chip pad; 112: Leads; 12: Plastic mold material; 13: Adhesive material; 14: IC chip; 15: Wire bonds; 200, 200a, 200b, 200c and 200d: Package in Package (PiP) Electronic Device; 201: Leadframe; 202: Chip pad; 203: Leads; 20: Plate Metallic Base Material; 20a: Upper Surface of Plate Metallic Base Material and Leads; 20b: Lower Surface of Plate Metallic Base Material and Leads; 21a and 21b: Patterned Resist Mask Layer; 22: The First Metal Material Layer; 22a: First Metal Material Layer Surface; 23: The Second Metal Material Layer; 23a: Second Metal Material Layer Surface; 24: Groove; 24a: Step-Shaped Structure Surface; 24b: Step-Shaped Structure; 25: Insulation filling material; 25a: Insulation filling material Surface; 26: Adhesive Material; 27: IC chip for Wire Bonding; 28: Wire bonds; 29: Mold material; 30: IC chip With Solder Bumps; 31: Bumps

DETAILED DESCRIPTION OF THE PREFERRED EMBODIMENTS

Figure 2A:
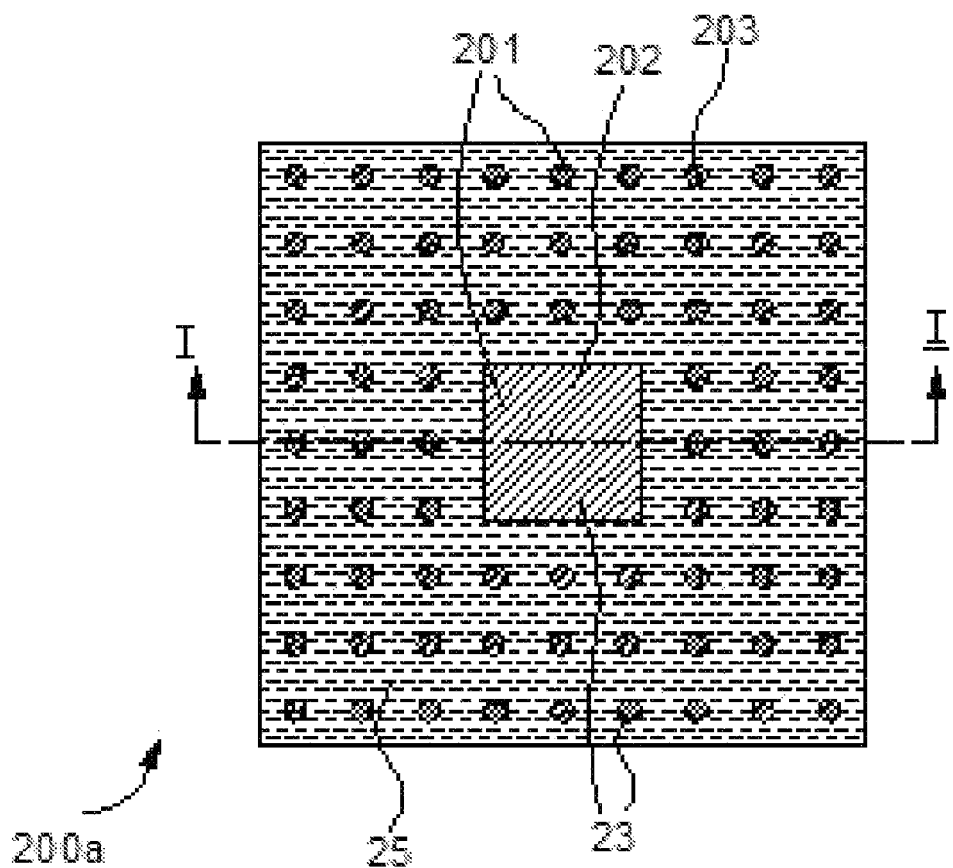
FIG. 2A is a bottom view of a Package in Package (PiP) electronic device in accordance with the present invention in which the cross section of leads is round-shaped and the leads at each side of chip pad are arrayed in parallel.
Figure 2B:
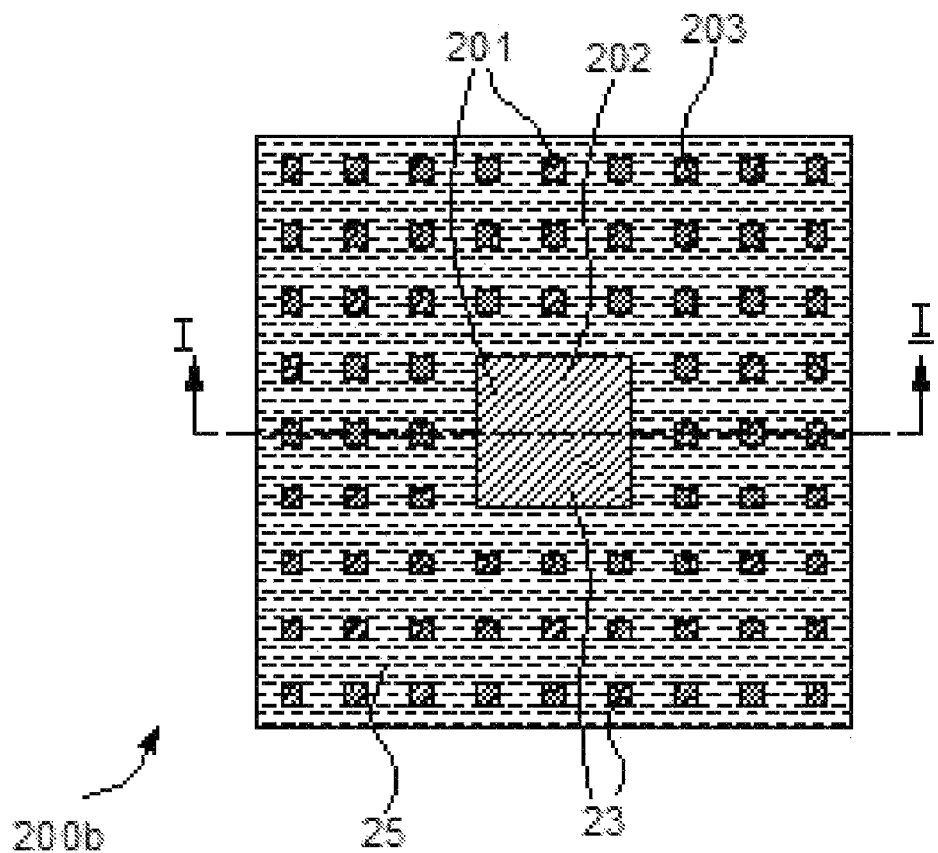
FIG. 2B is a bottom view of a Package in Package (PiP) electronic device in accordance with the present invention in which the cross section of leads is rectangle-shaped and the leads at each side of chip pad are arrayed in parallel.

The invention is further described in details in the combination with drawings:

FIG. 2A is a bottom view of PiP electronic device 200a in accordance with an embodiment of the invention in which the cross section of leads 203 is round-shaped and the leads 203 at each side of chip pad 202 are arrayed in parallel. FIG. 2B is a bottom view of PiP electronic device 200b in accordance with an embodiment of the invention in which the cross section of leads 203 is rectangle-shaped and the leads at each side of chip pad 202 are arrayed in parallel.

Referred to PiP electronic device 200a and 200b in FIG. 2A-B, leadframe 201 comprises chip pad 202 and a plurality of leads 203. Leads 203 are arrayed around chip pad 202 in the multi-row way. Leadframe 201 is configured with the second metal material layer 23 at the lower surface thereof and with insulation filling material 25 therein. The cross section of leads 203 in FIG. 2A is round-shaped while the cross section of leads 203 in FIG. 2B is rectangle-shaped.

Figure 3A:
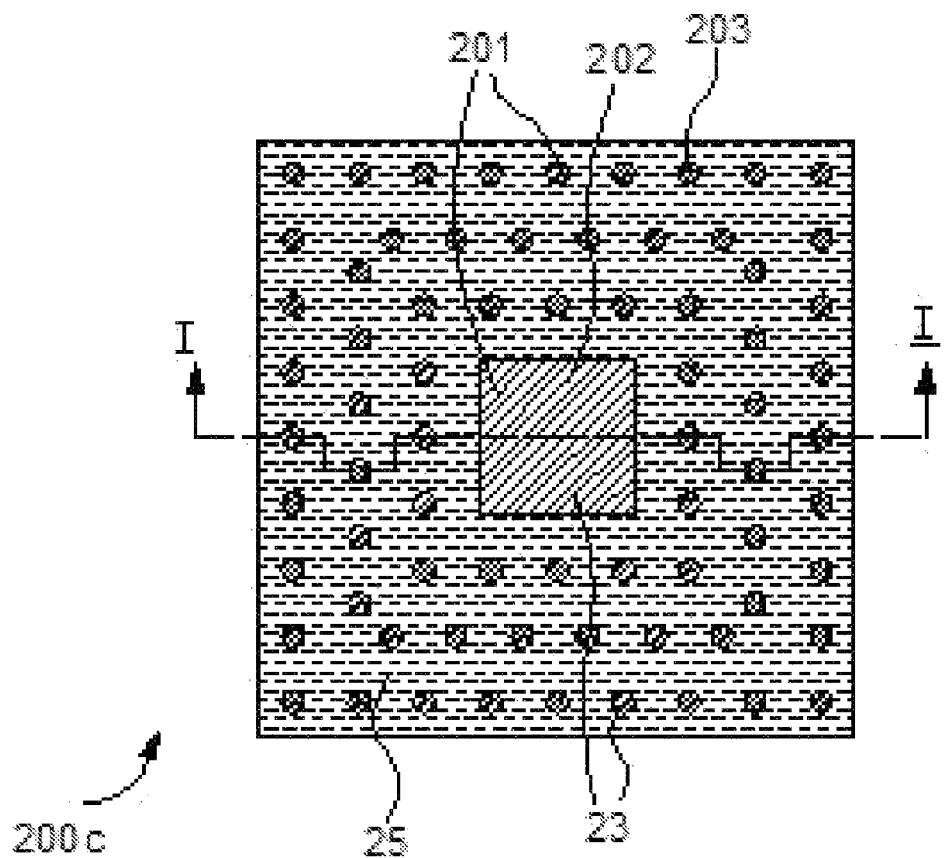
FIG. 3A is a bottom view of a Package in Package (PiP) electronic device in accordance with the present invention in which the cross section of leads is round-shaped and the leads at each side of chip pad are arrayed in stagger.
Figure 3B:
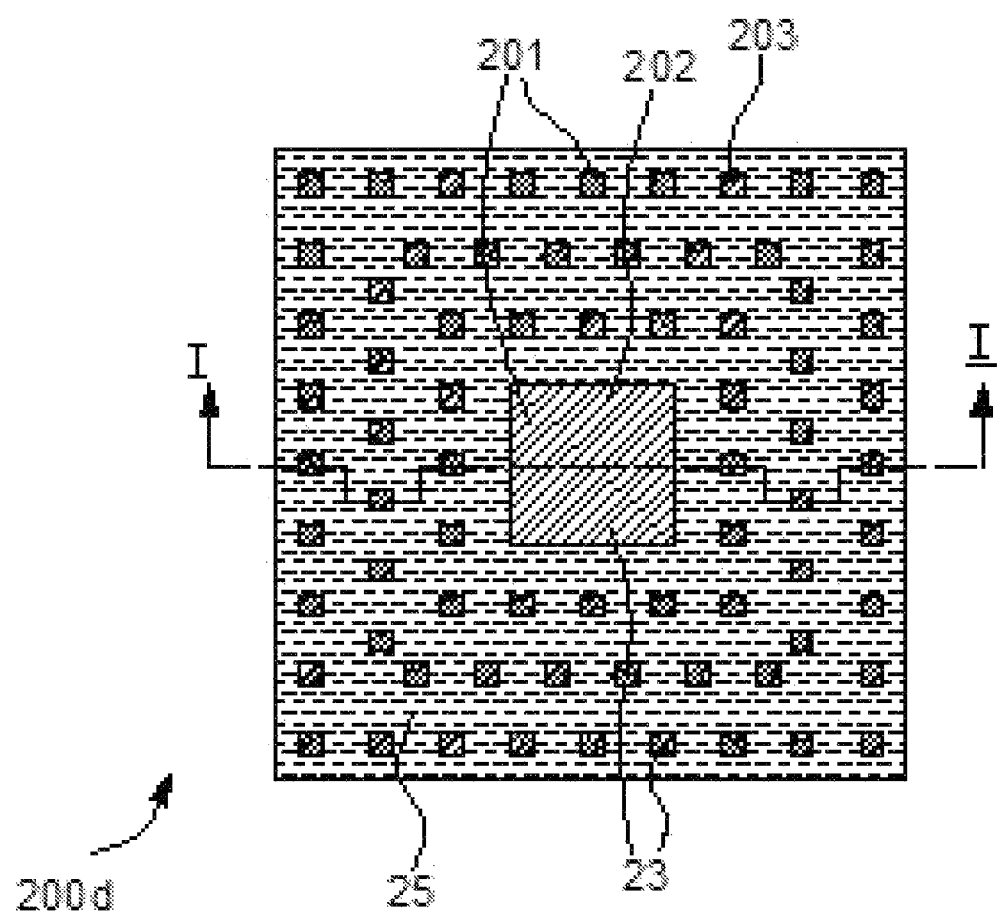
FIG. 3B is a bottom view of a Package in Package (PiP) electronic device in accordance with the present invention in which the cross section of leads is rectangle-shaped and the leads at each side of chip pad are arrayed in stagger.

FIG. 3A is a bottom view of PiP electronic device 200c in accordance with an embodiment of the invention in which the cross section of leads 203 is round-shaped and the leads 203 at each side of chip pad 202 are arrayed in stagger. FIG. 3B is a bottom view of PiP electronic device 200d in accordance with an embodiment of the invention in which the cross section of leads 203 is rectangle-shaped and the leads 203 at each side of chip pad 202 are arrayed in stagger.

Referred to PiP electronic device 200c and 200d in FIG. 3A-B, Leadframe 201 comprises chip pad 202 and a plurality of leads 203. Leads 203 are arrayed around chip pad 202 in the multi-row way. Leadframe 201 is configured with the second metal material layer 23 at the lower surface thereof and with insulation filling material 25 therein. The cross section of leads 203 in FIG. 3A is round-shaped while the cross section of the leads 203 in FIG. 3B is rectangle-shaped.

Figure 4:
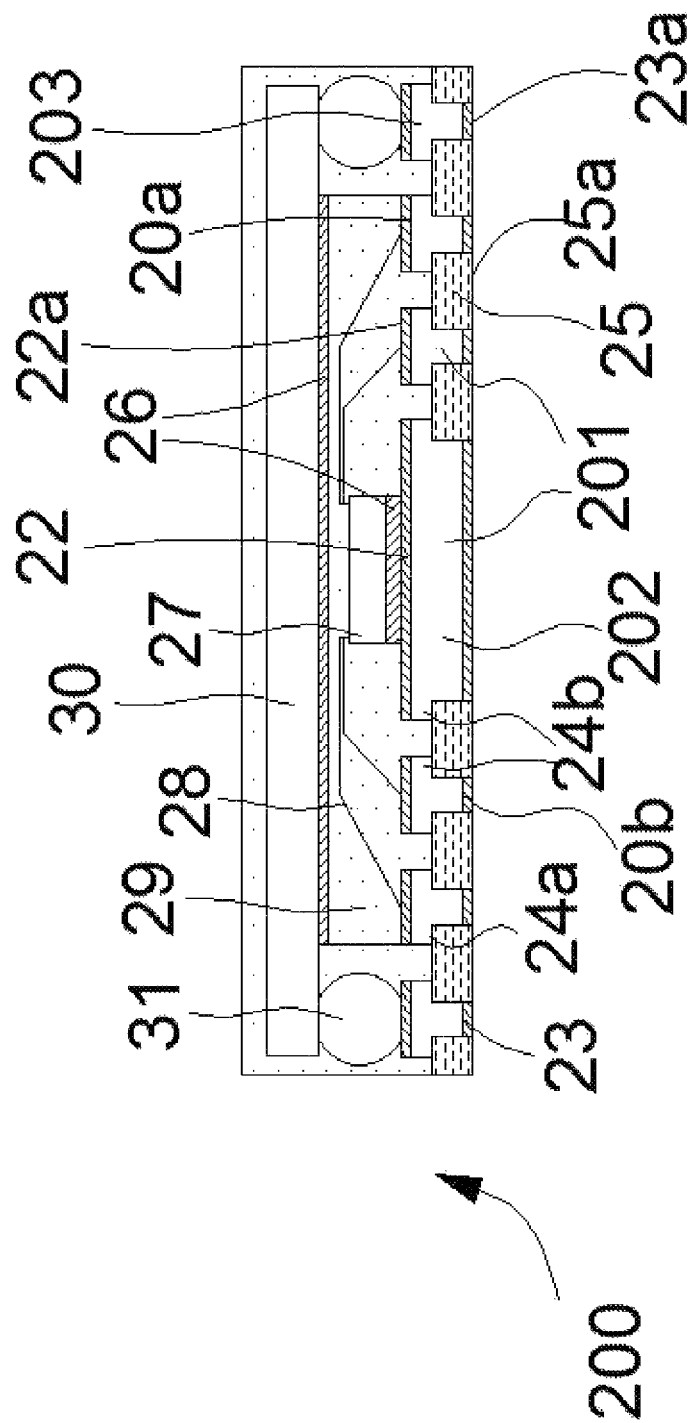
FIG. 4 is a cross-sectional view of Package in Package (PiP) electronic device taken along line I-I in FIG. 2A-B and FIG. 3A-B in accordance with the present invention.

FIG. 4 is a cross-sectional view taken along line I-I in FIG. 2A-B and FIG. 3A-B in accordance with an embodiment of the invention. PiP electronic device 200 comprises leadframe 201, first metal material layer 22, second metal material layer 23, insulation filling material 25, adhesive material 26, IC chip for wire bonding 27, wire bonds 28, mold material 29, IC chip with bumps 30, and solder bumps 31.

In the embodiment of FIG. 4, leadframe 201, used for electrical connection, heat dissipation and communicating with an external circuit, has step-shaped structure 24b along the vertical direction, and has upper surface 20a, lower surface 20b opposite to upper surface 20a, and step surface 24a of the step-shaped structure 24b. Leadframe 201 comprises chip pad 202 and a plurality of leads 203. Leads 203 are arrayed around chip pad 202 in the multi-row way. Chip pad 202 and leads 203 have step-shaped structure 24b. Chip pad 202 is located at the central position of leadframe 201, which has a rectangle-shaped cross section and a step-shaped structure 24b along the vertical direction at the periphery. A plurality of leads 203 are located at the periphery of chip pad 202 in the multi-row way, have step-shaped structure 24b along the vertical direction, and have a round-shaped or rectangle-shaped cross section.

The first metal material layer 22 and the second metal material layer 23 are located on the upper surface 20a and the lower surface 20b of leadframe 201 respectively. The first metal material layer 22 has surface 22a while the second metal material layer 23 has surface 23a.

Insulation filling material 25 is located under step-shaped structure 24 of leadframe 201 to support and protect leadframe 201. Insulation filling material 25 has surface 25a, which is at the same plane with the second metal material layer surface 23a.

IC chip for wire bonding 27 is fixed at the central position of chip pad 202 using adhesive material 26 such as silver particle filled epoxy, adhesive tape or other high thermal conductive materials. Mold material 29 encapsulates IC chip for wire bonding 27, adhesive material 26, wire bonds 28, leadframe 201 and the first metal material layer 22, to form a multi-row QFN package as an inner package.

IC chip with bumps 30 is bonded on lead 203 through flip-chip die bonder machine. The multi-row QFN package and IC chip with bumps 30 are connected through adhesive material 26. Solder bumps 31 are connected with the leads 203 by using reflow bonding or thermo-compression bonding. Mold material 29 encapsulates IC chip with bumps 27, solder bumps 31, multi-row QFN package, adhesive material 26, leadframe 201 and first metal material layer 22, to form a Package in Package (PiP) electronic device 200 based on multi-row QFN package type.

Figure 5E:
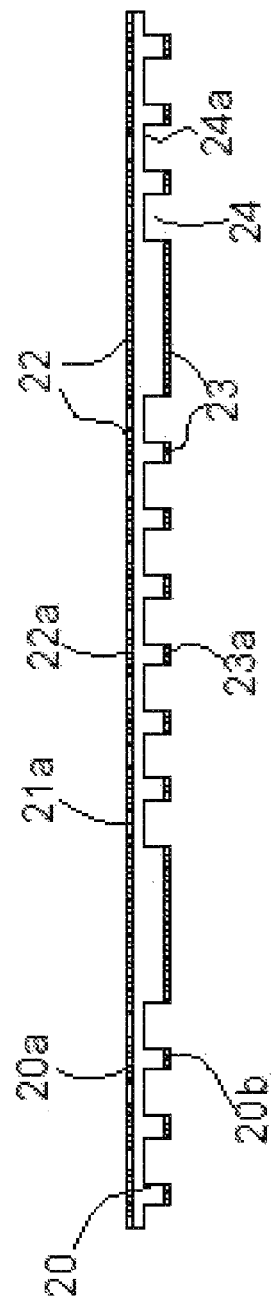
FIG. 5A-N shows an embodiment of manufacturing process steps of Package in Package (PiP) electronic device in accordance with the present invention, wherein the cross-sectional view are all taken along line I-I as shown in FIG. 4.
Figure 5F:
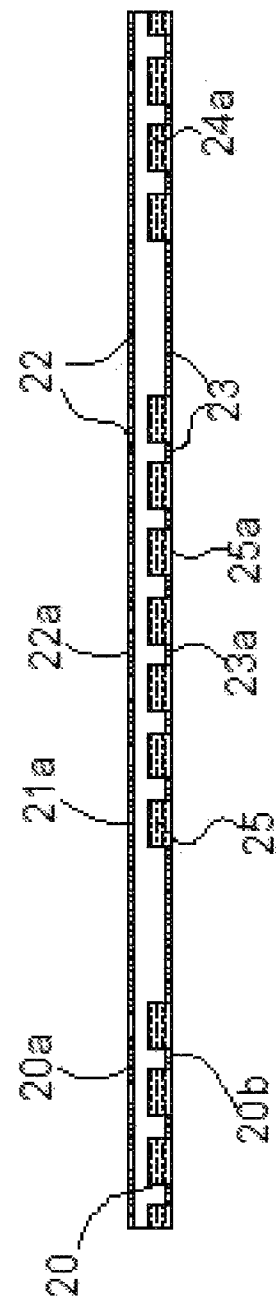
Figure 5G:
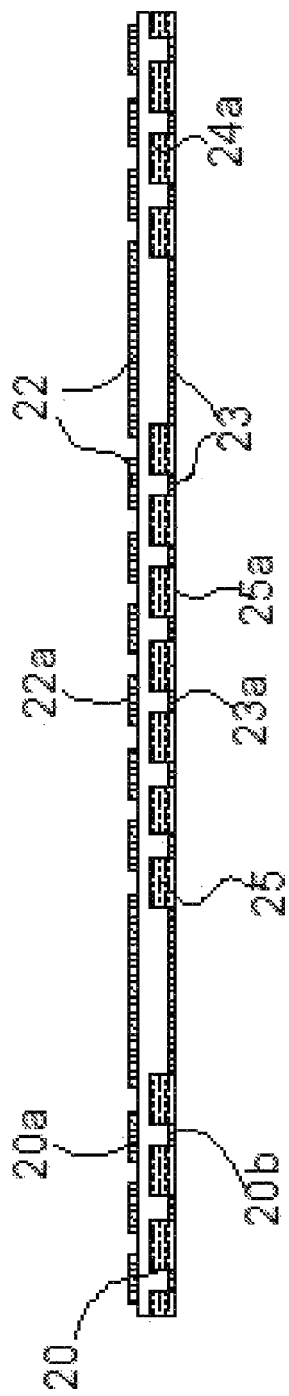
Figure 5H:
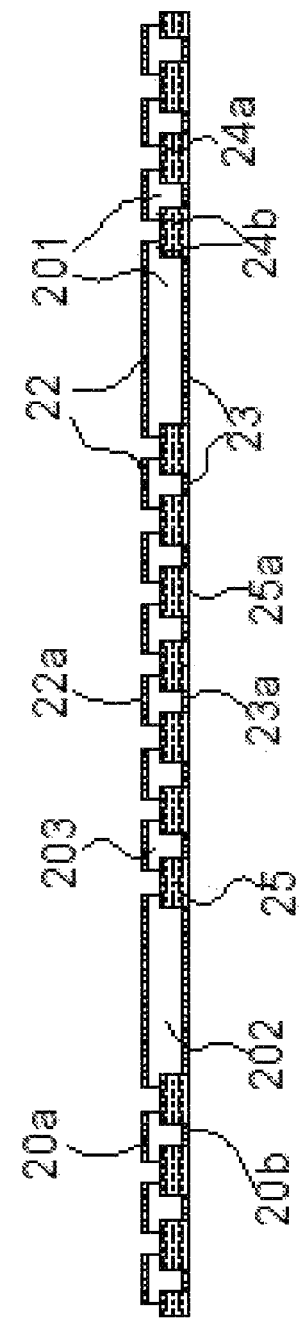
Figure 5I:
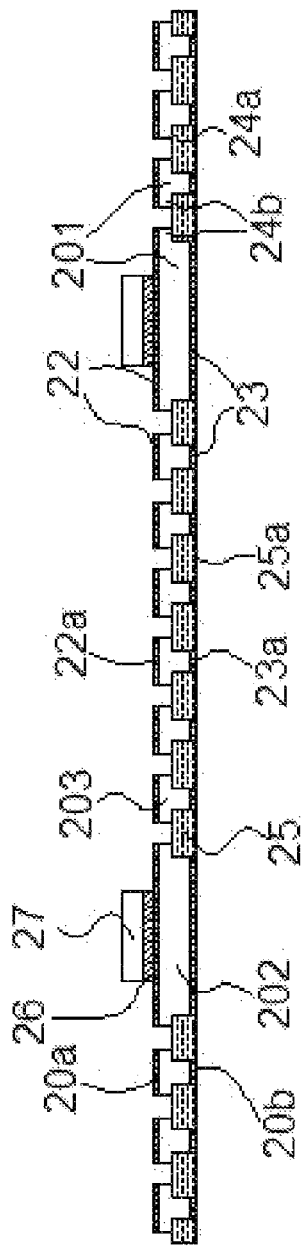
Figure 5J:
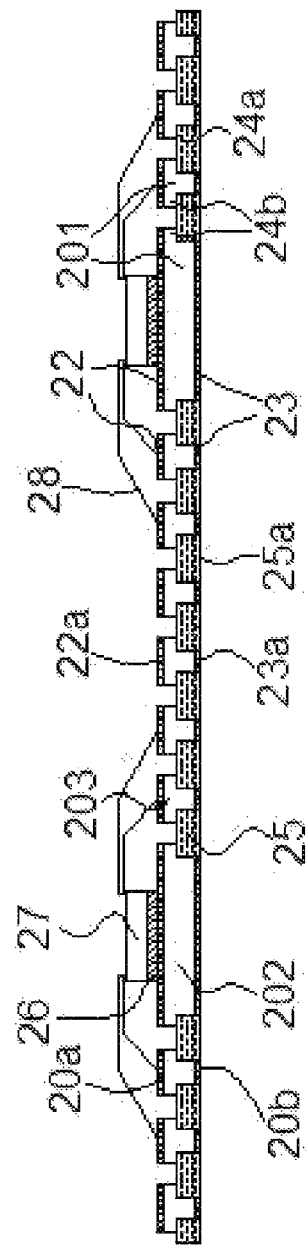
Figure 5K:
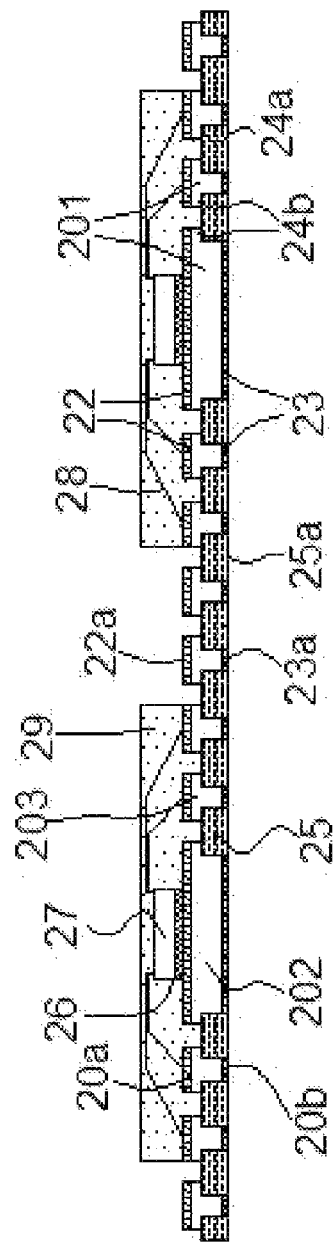
Figure 5L:
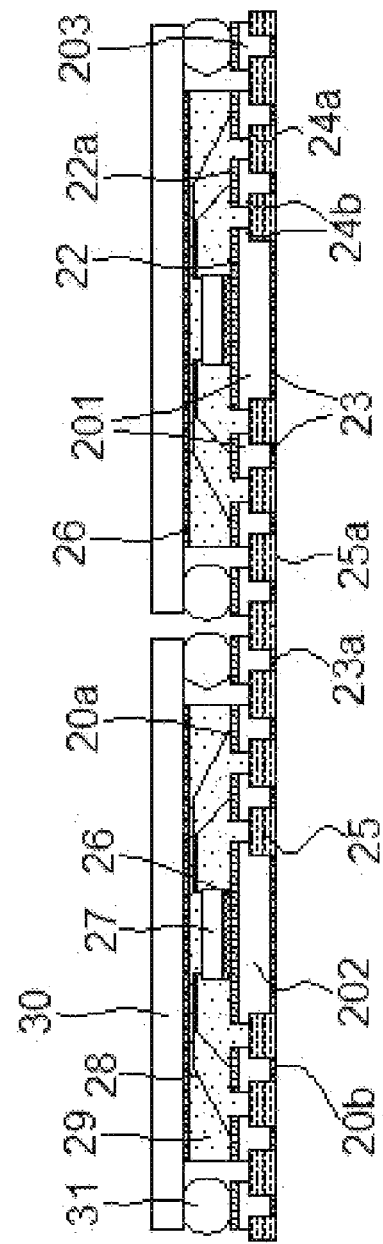
Figure 5M:
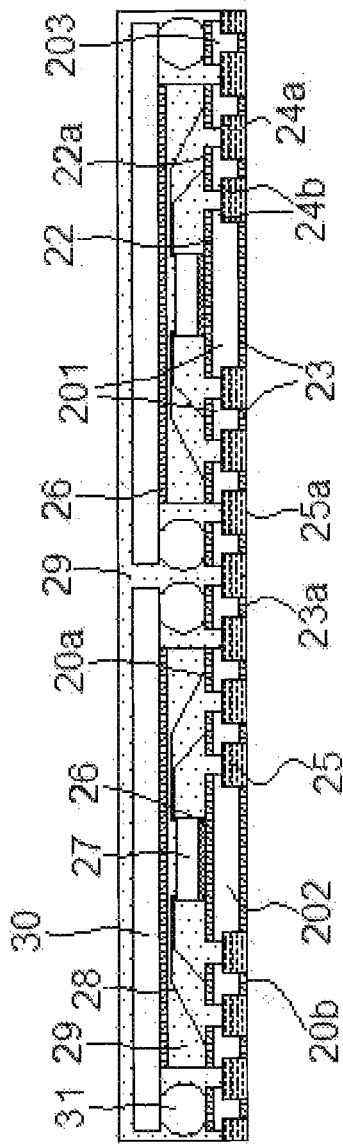
Figure 5N:
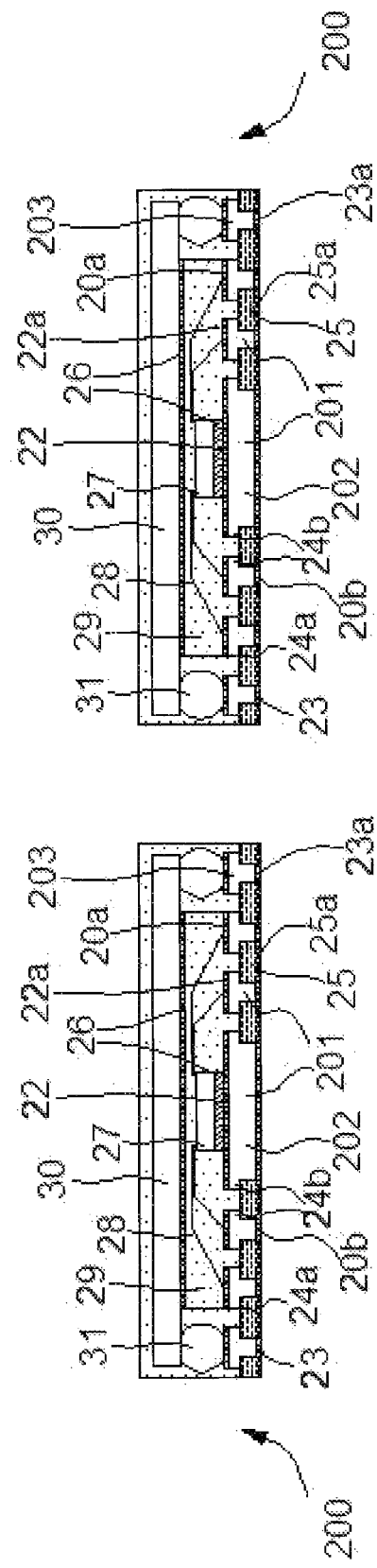

With the following FIG. 5A-N, the manufacturing process of PiP electronic device is described in details.

Referred to FIG. 5A, the invention provides a plate metallic base material 20 with the upper surface 20a and the lower surface 20b opposite to the upper surface 20a. Plate metallic base material 20 can be copper, copper alloy, iron, iron alloy, nickel, nickel alloy and other metal materials suitable for manufacturing leads. The thickness of plate metallic base material 20 is preferably in the range of 0.1 mm to 0.25 mm, such as 0.127 mm, 0.152 mm and 0.203 mm. The upper surface 20a and the lower surface 20b of plate metallic base material 20 are cleaned and pre-treated.

Referred to FIG. 5B, patterned resist mask layers 21a and 21b are respectively formed with windows on the upper surface 20a and the lower surface 20b of plate metallic base material 20. The windows are uncovered areas on the upper surface 20a and the lower surface 20b of plate metallic base material 20 by the pattered resist mask layers. Patterned resist mask layers 21a and 21b protect plate metallic base material 20 covered with them. In the following manufacturing processes, plate metallic base material 20 uncovered with patterned resist mask layers 21a and 21b are etched. Patterned resist mask layers 21a and 21b are required to be firmly bonded onto plate metallic base material 20 and have the ability of thermal stability, etching resistance and plating resistance. The methods of forming patterned resist mask layers 21a and 21b may be screen printing method and photosensitive imaging method. As to screen printing method, the materials of patterned resist mask layers 21a and 21b are non-photosensitive resin, printing ink or other polymers, and are directly formed with screen printing process. As to photosensitive imaging method, a photoinduced wet film or dry film is coated on the upper surface 20a and the lower surface 20b of plate metallic base material 20 respectively; then selective exposure and development processes are carried out in sequence to form patterned resist mask layers 21a and 21b.

Referred to FIG. 5C, the first metal material layer 22 is formed on the window areas of the upper surface 20a of plate metallic base material 20. The first metal material layer 22 has surface 22a. The second metal material layer 23 is formed on the window areas of the lower surface 20b of plate metallic base material 20. The second metal material layer 23 has surface 23a. The first metal material layer 22 and the second metal material layer 23 are formed by using electroplating method, chemical plating method, evaporation method, sputtering method and other methods. In the embodiment, electroplating method and chemical plating method are preferred. The first metal material layer 22 and the second metal material layer 23 may be Ni, Pd, Au, Ag, Sn and corresponding alloys. In the embodiment, the first metal material layer 22 and the second metal material layer 23 are Ni—Pd—Au plating layer. As to the first metal material layer 22, the external Au plating layer and the middle Pd plating layer guarantee wire bonding quality of wire bonds 28 and flip-chip bonding quality of solder bumps 31 while the inner Ni plating layer is taken as a diffusion resist layer to prevent the over-growth of intermetallic compound caused by diffusion-chemical reaction from being generated. The over-growth of intermetallic compound affects the reliability of bonding joints. As to the second metal material layer 23, the external Au plating layer and the middle Pd plating layer guarantee the wettability of the solder on leadframe 201 and improve the surface mounting quality of package on PCB board while the inner Ni plating layer is taken as the diffusion resist layer to prevent the over-growth of intermetallic compound caused by diffusion-chemical reaction from being generated. The over-growth of intermetallic compound affects the reliability of bonding solder joints.

Referred to FIG. 5D, patterned resist mask layer 21b on the lower surface 20b of plate metallic base material 20 is removed. The removing method in the embodiment may be chemical reaction method and mechanical method. As to chemical reaction method, a soluble alkaline solution, such as KOH, NaOH and the like, is selected. The soluble alkaline solution is sprayed and reacted chemically with patterned resist layer 21b to dissolve it. The organic solution may be also selected to remove patterned resist mask layer 21b. After patterned resist mask layer 21b is removed, only the second metal material layer 23 is left on the lower surface 20b of plate metallic base material 20.

Referred to FIG. 5E, the second metal material layer 23 on the lower surface 20b of plate metallic base material 20 is taken as an etching resist layer. An etchant only etching plate metallic base material 20 is selected. The lower surface 20b of plate metallic base material 20 is half-etched by using praying method to form grooves 24 and step-shaped structure surface 24a. The etching depth range may be within 40%-90% of the thickness of plate metallic base material 20. In the embodiment, an upper spraying method is preferred. Furthermore, a small amount of organic substance may be added into the etchant to reduce the side-etch effect of the etchant on plate metallic base material 20. As the second metal material layer 23 is adopted as the etching resist layer, the etchant is preferably alkaline etchant, such as alkaline copper chloride etchant, ammonium chloride etchant and the like, to reduce the damaging effects of the etchant on the second metal material layer 23.

Referred to FIG. 5F, grooves 24 are filled with insulation filling material 25. Insulation filling material 25 has the surface 25a at the same plane with the second metal material surface 23a. In the embodiment, insulation filling material 25 may be thermosetting plastic material, plug-hole resin, and solder mask. Insulation filling material 25 has the ability of acid resistance and alkali resistance to guarantee that the sequent manufacturing processes do not damage it. Insulation filling material 25 is filled in grooves 24 with injection molding method or screen printing method. Curing process is carried out after filling to obtain proper hardness. The excessive insulation filling material 25 is removed with mechanical grinding method or chemical processing method. The surface 25a of insulation filling material 25 and the second metal material layer surface 23a are at the same plane.

Referred to FIG. 5G, patterned resist mask layer 21a on the upper surface 20a of plate metallic base material 20 is removed. The removing method in the embodiment may be chemical reaction method and mechanical method. As to chemical reaction method, a soluble alkaline solution, such as KOH, NaOH and the like, is selected. The soluble alkaline solution is sprayed and reacted chemically with patterned resist layer 21a to dissolve it. The organic solution is also selected to remove patterned resist layer 21a. After patterned resist layer 21a is removed, only the first metal material layer 22 is left on the upper surface 20a of plate metallic base material 20.

Referred to FIG. 5H, the first metal material layer 22 on the upper surface 20a of plate metallic base material 20 is taken as etch resist layer. An etchant only etching plate metallic base material 20 is selected to carry out half-etching process. Step-shaped structure surface 24a is formed by using spraying method. Leadframe 201 is formed when insulation filling material 25 is exposed during half-etching process, Leadframe 201 comprises chip pad 202 and leads 203 arrayed around chip pad 202 in the multi-row way. Chip pad 202 and leads 203 are bonded together through insulation filling material 25. Step-shaped structure 24b has step-shaped structure surface 24a. In the embodiment, upper spraying method is preferred. A small amount of organic substance is added into the etchant, so as to reduce the side-etch effect of the etchant on plate metallic base material 20. As the first metal material layer 22 is adopted as the etching resist layer, the etchant is preferably alkaline etchant, such as alkaline copper chloride etchant, ammonium chloride etchant and so on, to reduce the damaging effects of the etchant on the first metal material layer 22.

Referred to FIG. 5I, by using adhesive material 26, IC chip for wire bonding 27 is bonded at the upper surface 20a of leadframe 201 and located at the central position of chip pad 202. In the embodiment, adhesive material 26 may be adhesive tape, silver particle filled epoxy resin and other high thermal conductivity materials. After IC chip for wire bonding 27 is bonded, adhesive material 26 is needed to be baked and cured, so as to enhance the adhesion strength between IC chip for wire bonding 27 and the first metal material layer 22.

Referred to FIG. 5J, IC chip for wire bonding 27 is connected to a plurality of leads 203 configured with the first metal material layer 22 by using wire bonds 28. In the embodiment, wire bonds 28 can be gold wire, aluminum wire, copper wire, palladium-plated copper wire, etc.

Referred to FIG. 5K, with injection molding method, environment-friendly mold material 29 with low water absorption rate and low stress encapsulates IC chip for wire bonding 27, adhesive material 26, wire bonds 28, leadframe 201 and the first metal material layer 22 to form multi-row QFN packages as inner packages. In the embodiment, mold material 29 may be thermosetting polymer and other materials. Mold material 29 is baked and cured after molding process to obtain proper hardness. Insulation filling material 25 and mold material 29 may be the same material. Step-shaped structure 24b of leadframe 201 have the interlocking effect, which may effectively prevent the interfacial delamination between leadframe 201, mold material 29 and insulation filling material 25, may prevent lead 203 and chip pad 202 from falling off, and may effectively prevent moisture from diffusing into inside along the combination interface.

Referred to FIG. 5L, IC chip with bumps 30 is bonded on lead 203 through a flip-chip die bonder machine. The multi-row QFN package and IC chip with bumps 30 are connected through adhesive 26. Solder bumps 31 are connected with leads 203 by using reflow bonding or thermo-compression bonding. In the embodiment, solder bumps 31 may be Lead-based solder, Lead-free solder and other metal materials.

Referred to FIG. 5M, with injection molding method, mold material 29 encapsulates IC chip with bumps 27, solder bumps 31, multi-row QFN package, adhesive 26, leadframe 201 and the first metal material layer 22 to form an array of Package in Package (PiP) electronic device. In the embodiment, mold material 29 may be thermosetting polymer and other materials. Curing process is carried out after molding process to obtain proper hardness. After curing process, laser printing process is carried out for PiP electronic device array.

Referred to FIG. 5N, PiP electronic device array is sawed. Mold material 29 and insulation filling material 25 are sawed and separated to form PiP electronic device unit 200. In the embodiment, blade sawing method, laser sawing method or water jet sawing method may be used for sawing process. Only mold material 29 and insulation filling material 25, rather than the metal material of leadframe 201, are sawed.

What is claimed is:

1. A method for manufacturing a Package in Package (PiP) electronic device, the method comprising:

forming a first patterned resist mask layer on a first surface of a plate metallic base material, the first patterned resist mask layer having windows exposing a first portion of the first surface of the plate metallic base material;

forming a second patterned resist mask layer on a second surface of the plate metallic base material, the second patterned resist mask layer having windows exposing a first portion of the second surface of the plate metallic base material;

forming a first metal material layer on the first portion of the first surface of the plate metallic base material exposed by the windows of the first patterned resist mask layer;

forming a second metal material layer on the first portion of the second surface of the plate metallic base material exposed by the windows of the second patterned resist mask layer;

removing at least partially the second patterned resist mask layer from the second surface of the plate metallic base material to expose a second portion of the second surface of the plate metallic base material;

etching a second portion of the plate metallic base material through the exposed second portion of the second surface to form grooves;

filling the grooves with an insulation filling material;

removing at least partially the first patterned resist mask layer from the first surface of the plate metallic base material to expose a second portion of the first surface of the plate metallic base material;

etching a first portion of the plate metallic base material through the exposed second portion of the first surface to form a lead frame having a step-shaped structure, the lead frame comprising a chip pad and a plurality of leads surrounding the chip pad in one or more rows, each of the chip pad and the plurality of leads comprising a respective portion of the first metal material layer, a respective portion of the second metal material layer, and a respective portion of the plate metallic base material between the respective portion of the first metal material layer and the respective portion of the second metal material layer;

bonding a first integrated circuit (IC) chip to the lead frame by attaching the first IC chip to a central position of the respective portion of the first metal material layer of the chip pad via a first adhesive material and by connecting the first IC chip to one or more of the plurality of leads via one or more wire bonds;

encapsulating with a first mold material the first IC chip, the first adhesive material, the one or more wire bonds, and a portion of the lead frame including the chip pad and the one or more of the plurality of leads but excluding the second metal material layer thereof to form a multi-row Quad Flat No-leads (QFN) package as an inner package;

bonding a second IC chip having a plurality of solder bumps to the lead frame by attaching the second IC chip to a side of the inner package away from the second metal material layer thereof via a second adhesive material and by connecting the plurality of solder bumps to corresponding one or more leads of the plurality of leads that are not encapsulated in the inner package using reflow bonding or thermo-compression bonding techniques;

encapsulating with a second mold material the second IC chip, the inner package, the second adhesive material, and the corresponding one or more leads of the plurality of leads that are not encapsulated in the inner package to form the PiP electronic device.

2. The method for manufacturing the PiP electronic device of claim 1, wherein the PiP electronic device is formed through a single filling process and two molding processes.

3. The method for manufacturing the PiP electronic device of claim 1, further comprising:

carrying out laser printing for the PiP electronic device.

4. The method for manufacturing the PiP electronic device of claim 1, further comprising:

forming an array of PiP electronic devices that comprises more than one of the PiP electronic devices that are formed concurrently but mutually connected by at least one of the first mold material, the second mold material and the insulation filling material; and separating the PiP electronic devices of the array of PiP electronic devices from each other by sawing the array of PiP electronic devices.

5. The method for manufacturing the PiP electronic device of claim 4, wherein the sawing of the array of PiP electronic devices comprises sawing the array of PiP electronic devices with a blade sawing method, a laser sawing method or a water jet sawing method, and wherein the first mold material, the second mold material and the insulation filling material are sawed.

* * * * *